United States Patent
Waggoner et al.

(12) 
(10) Patent No.: US 6,218,706 B1
(45) Date of Patent: *Apr. 17, 2001

(54) INTEGRATED CIRCUIT WITH IMPROVED ELECTROSTATIC DISCHARGE PROTECTION CIRCUITRY

(75) Inventors: Charles D. Waggoner, Richardson, TX (US); Antonio Imbruglia, Catania; Raffaele Zambrano, Viagrande, both of (IT)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/418,850

(22) Filed: Oct. 15, 1999

Related U.S. Application Data

(63) Continuation of application No. 09/030,149, filed on Feb. 25, 1998, now Pat. No. 6,034,400, which is a continuation-in-part of application No. 08/777,784, filed on Dec. 31, 1996, now Pat. No. 5,917,220.

(51) Int. Cl.[7] .............................. H01L 23/62; H01L 29/00
(52) U.S. Cl. .......................... 257/355; 257/356; 257/360; 257/531
(58) Field of Search ..................................... 257/377, 355, 257/356, 357, 360, 531, 207

(56) References Cited

U.S. PATENT DOCUMENTS

| | | |
|---|---|---|
| 4,819,047 | 4/1989 | Gilfeather et al. . |
| 5,124,877 | 6/1992 | Graham . |
| 5,173,755 | 12/1992 | Co et al. . |
| 5,237,395 | 8/1993 | Lee . |
| 5,641,981 | 6/1997 | Isono et al. . |
| 5,917,220 * | 6/1999 | Waggoner .............................. 257/360 |
| 5,936,298 * | 8/1999 | Capocelli et al. .................... 257/531 |
| 6,034,400 * | 3/2000 | Waggoner et al. ................... 257/355 |

* cited by examiner

Primary Examiner—Steven Loke
(74) Attorney, Agent, or Firm—Theodore E. Galanthay; Lisa K. Jorgenson; Peter J. Thoma

(57) ABSTRACT

An MOS integrated circuit device with improved electrostatic protection capability includes high and low voltage rails for bringing externally-supplied power to points within the chip. Input bonding pads communicate input signals to the chip from external sources. Clamping circuitry connected to the input bonding pads clamps the input bonding pads to the low voltage rail during an electrostatic discharge event appearing on the input bonding pads. A receiver circuit is coupled to each input bonding pad. Each receiver circuit has a receiver input node, a receiver output node, and overvoltage-sensitive MOS circuitry between the input and output nodes. A conductor connects each input bonding pad to its receiver circuit. The conductor has a length greater than the distance between the input bonding pad and its receiver circuit. The conductor has an inductance sufficient to prevent high frequency components of ESD events received at an input bonding pad from reaching its receiver circuit. The conductor includes at least one fold for extending the length of the conductor to exceed the distance between the input bonding pad and the receiver input node.

20 Claims, 3 Drawing Sheets

INTEGRATED CIRCUIT WITH IMPROVED ELECTROSTATIC DISCHARGE PROTECTION CIRCUITRY

CROSS-REFERENCE TO RELATED APPLICATIONS

This application is a continuation of application Ser. No. 09/030,149, filed Feb. 25, 1998, now U.S. Pat. No. 6,034,400, which is a continuation-in-part of application Ser. No. 08/777,784, filed Dec. 31, 1996, now U.S. Pat. No. 5,917,220.

BACKGROUND OF THE INVENTION

The present invention generally relates to integrated circuits and more particularly to circuitry for protecting integrated circuit devices from overvoltages produced by electrostatic discharge ("ESD") events applied to the inputs of the device.

Integrated circuit ("IC") technology has advanced from generation to generation with ever decreasing circuit element dimensions and ever increasing circuit densities in the thumb-nail size semiconductor chips in which such circuits are fabricated. The thickness of insulation layers, such as gate oxide layers, has undergone a commensurate size reduction, with state-of-the-art process technologies using gate oxides under 100 Å in thickness. The dielectric breakdown of such ultrathin oxide insulating layers has made these recent generation devices more sensitive to overvoltages, requiring more sophisticated overvoltage protection schemes.

A common source of overvoltages to which IC devices are exposed is ESD, which can occur merely from human contact. Such ESD events can destroy an IC device by shorting through one or more of the thin oxide insulating layers in the device. Such ESD events can produce voltage spikes in the kilovolt range. According to standard industry practice, IC devices are expected to survive an ESD event of 2 kV without damage.

A complicating factor in designing overvoltage protection circuitry is that normal system voltages, which can be communicated as inputs to the IC device, are often higher than the voltage supply levels specified for normal operation of the IC device. For example, the most recent generations of IC devices, which are made using complementary metal-oxide-semiconductor (CMOS) technology, are designed to operate using a 3.3 volt supply, whereas IC devices of earlier generations were designed to operate using a 5.0 volt supply. Many existing systems are designed around the 5.0 volt standard, such that new pieces of electronic equipment using the latest IC devices that operate on a 3.3 volt supply must be adapted to receive 5.0 volt signals. This complicates the design of ESD protection circuitry since such circuitry for devices operating with 5.0 volt supplies was designed on the assumption that any input signal in excess of 5.0 volts would be an anomaly and indicative of the onset of an overvoltage event. However, for devices operating with 3.3 volt supplies and intended to tolerate 5.0 volt input signals, such input signals could be misinterpreted as possible ESD events thus triggering overvoltage protection circuitry unless such circuitry has been redesigned to accommodate normal input signals at levels of about 1.7 volts higher than the supply voltage. As of yet, no comprehensive solution to this problem has been found.

Thus, it would be desirable to provide a more effective solution to the problem experienced by 3.3 volt IC devices receiving 5.0 volt input signals. It would be desirable to provide overvoltage protection circuitry that protects the IC device from ESD events as well as making 3.3 volt IC devices compatible with 5.0 volt systems. In order to fully appreciate the improvement in the overvoltage protection circuitry of the present invention hereinafter described, the following description of the relevant prior art is provided with reference to FIGS. 1–4.

Referring to FIG. 1, a portion of an overvoltage protection circuit used in a prior art integrated circuit device is illustrated and designated generally by reference numeral 10. The overvoltage protection circuit 10 is connected between a high voltage power bus or rail 12 and a low voltage power bus or rail 14. The high voltage rail 12 is connected to a bonding pad (not shown) that receives from an external source a high voltage supply, conventionally designated $V_{DD}$. The low voltage rail 14 is connected to a bonding pad (not shown) that receives from the external source a low voltage supply or ground, conventionally designated $V_{SS}$.

The integrated circuit device of which the overvoltage circuit 10 is a part includes a plurality of input bonding pads P, only two of which are shown for ease of illustration. Each such input bonding pad P is connected between diodes $D_1$ and $D_2$ as shown, $D_1$ connecting the bonding pad to the low voltage rail 14 and $D_2$ connecting the bonding pad to the high voltage rail 12. An overvoltage appearing on an input bonding pad P can be either a positive or negative voltage. The diodes $D_1$ and $D_2$ provide one form of overvoltage protection for the IC drive, diodes $D_2$ turning on to couple the input bonding pads to the $V_{DD}$ rail 12 when the overvoltage is positive and diodes $D_1$ turning on to couple the input bonding pads to the $V_{SS}$ rail 14 when the overvoltage is negative. In practice, each diode $D_1$ and diode $D_2$ are actually sets of relatively large diodes (e.g., four per set connected in parallel), providing low impedance ESD conduction paths from the input bonding pads P to the $V_{DD}$ and $V_{SS}$ rails.

The signal on each input bonding pad P is communicated to a corresponding receiver circuit 16 (labeled "Re") through a node 18 disposed between the input bonding pad P and the anode of the corresponding diode $D_2$ as shown. An ESD clamp 20 corresponding to each input bonding pad P is connected between the node 18 and the low voltage rail 14. Along with output circuits (not shown) the receiver circuits 16 comprise the sensitive input/output circuitry of the device that requires protection from overvoltages coming from external sources.

The ESD clamp 20 used to clamp each input bonding pad P is normally nonconductive but is triggered to become conductive in response to an ESD event appearing on the input bonding pads. Short duration voltage transients of several thousand volts can arise from human or machine handling of the IC device prior to installation in its end-use equipment. High voltage transients can arise from other sources after the IC device is installed in its end-use equipment. When an input bonding pad P experiences an ESD event, its ESD clamp 20 is triggered and quickly becomes conductive to limit the voltage differential seen by circuit elements of the IC device to a relatively low level that does not damage sensitive structures of the device. This ESD protection scheme requires an ESD clamp 20 for each input bonding pad P, and therefore requires a commitment of considerable chip space to implement.

One implementation of a suitable ESD clamp known in the art is shown in FIG. 2. The ESD clamp 20 of FIG. 2 has an N-channel MOS transistor $T_C$ connected between node 18 and the $V_{SS}$ rail 14. A circuit for triggering transistor $T_C$ includes a Zener diode Z, resistors $R_1$ and $R_2$ and a diode D connected in series between node 18 and the $V_{SS}$ rail 14. A node 22 is connected between resistors $R_1$ and $R_2$ to the gate of transistor $T_C$. The Zener diode Z has its cathode connected to node 18 and its anode connected to resistor $R_1$. Diode D has its anode connected to resistor $R_2$ and its cathode connected to the $V_{SS}$ rail 14. Transistor $T_C$ has a parasitic bipolar mode of operation designated by transistor $Q_C$ shown in dashed outline. Transistor $T_C$ is made very wide with a short channel length so that it is capable of efficiently shunting the relatively high currents characteristic of an ESD event.

The values of elements Z, $R_1$, $R_2$ and D are chosen so that the gate of transistor $T_C$ will see a voltage of about 3 volts when an ESD event occurs and the voltage on node 18 rises above a trigger voltage of about 7.0 to 7.5 volts. Once transistor $T_C$ is turned on by such an ESD event, bipolar conduction through transistor $Q_C$ will occur and will continue until the voltage on node 18 falls below the trigger voltage level. A more complete explanation of the operation of this particular ESD clamp 20 is provided in U.S. patent application entitled "Overvoltage Protection Device for MOS Integrated Circuits," Ser. No. 08/712,058, filed Sep. 10, 1996.

Another ESD clamp or shunt intended for use as part of a CMOS integrated circuit output circuit is described in U.S. Pat. No. 5,173,755, issued Dec. 22, 1992. A protection circuit for shunting between the power rails is described in U.S. Pat. No. 5,237,395, issued Aug. 17, 1993. Additionally, U.S. Pat. No. 5,124,877, issued Jun. 23, 1992, describes an electrostatic discharge protection circuit that includes a discharge reference rail that is connected to the positive power supply terminal ($V_{DD}$) by a level shifter circuit, which shunts the excess voltage of an ESD event from the input bonding pads to the positive power supply terminal. It is preferable, however, to shunt a positive ESD event to the negative power supply terminal ($V_{SS}$), as occurs using the ESD clamp 20 of FIGS. 1 and 2 herein.

The transistor $T_C$ shown in FIG. 2 may be implemented by the structure shown in FIG. 3, in which the transistor is designated generally by reference numeral 30. It has become standard practice in the art to fabricate MOS transistors with source and drain regions having both lightly doped and heavily doped portions. Such transistors are known as lightly doped drain ("LDD") transistors. By a slight modification of the fabrication process, the transistor 30 of FIG. 3 can be made with characteristics that are advantageous when used in an ESD clamping circuit.

In FIG. 3, transistor 30 is shown in cross section as including doped regions formed in a monocrystalline silicon substrate (shown partially broken away) with a gate structure constructed thereon. In particular, N+ doped source and drain regions 32 and 34 are formed in a P well 36, the entire structure being formed atop an N-type major body portion 38 of the substrate. A polycrystalline silicon ("polysilicon") gate 40 is formed atop a gate oxide layer 42, which is grown on the top surface of the substrate between the source and drain regions 32 and 34. Spacer oxide layers 44 and 46 are used in the course of processing to define the edges of the source and drain regions 32 and 34, which are formed by an ion implantation step. Ordinarily, in conventional processes, a light dose of an N-type dopant (e.g., phosphorus) is implanted prior to formation of the spacer oxide layers 44 and 46. Such a conventional light dose implant produces lightly dope drain regions in the locations indicated by the dashed regions 48. Such LDD regions 48 normally extend under the gate 40 and define a channel region therebetween.

When it is desired to form modified transistor 30, the light dose ion implantation can be prevented from reaching the silicon surface at the site of transistor 30 by providing a mask covering that site, thereby producing the structure depicted in FIG. 3. Lacking the conventional LDD regions 48, transistor 30 has a higher than normal turn-on threshold voltage in the range from about 1.2 to 2.0 volts. A normal turn-on threshold voltage is about 0.6 volts. The higher turn-on threshold voltage of modified transistor 30 is due to the small gaps between the edges of the gate 40 and the facing edges of the N+ source and drain regions 32 and 34.

Referring again to FIG. 2, when transistor $T_C$ is fabricated as just described without the conventional LDD regions, it can be advantageously employed in the ESD clamp 20. A conventional N-channel transistor having LDD implants could be damaged by the relatively high parasitic conduction that occurs in an ESD event. The relatively high currents going through the leading edges of the LDD regions can damage the silicon at such points causing the transistor to fail immediately or become excessively leaky and lead to a subsequent failure. Using a modified transistor 30 without the conventional LDD regions for transistor $T_C$ provides a more rugged transistor capable of relatively high, nondestructive parasitic conduction.

Now referring to FIG. 4, the details of a common implementation of a receiver circuit, which was designed for use with a 5.0 volt $V_{DD}$ supply, is shown in the dashed outline labeled by reference numeral 16. The receiver circuit 16 may be one of various similar receiver circuits that may be protected by the overvoltage protection circuit 10 of FIG. 1. One input bonding pad P and its respective set of diodes $D_1$ and $D_2$ are shown in FIG. 4 connected to the receiver circuit 16. A signal line 50 connects the input bonding pad P to an input node 52 of the receiver circuit 16. A CMOS inverter consisting of N-channel MOS transistor $T_1$ and P-channel MOS transistor $T_2$ is connected between the $V_{DD}$ and $V_{SS}$ power rails. The CMOS inverter has an input node 54 connecting the gates of transistors $T_1$ and $T_2$ and an output node 56 connecting the drains of transistors $T_1$ and $T_2$. The output node 56 is the receiver output node that communicates with other circuitry (not shown) of the IC device. The source of transistor $T_1$ and its P well are connected to the $V_{SS}$ rail. The source of transistor $T_2$ and its N well are connected to the $V_{DD}$ rail.

Resistors $R_3$ and $R_4$ connect the inverter input node 54 to the receiver input node 52. Resistor $R_3$ is formed in the substrate in a P+ region set in an N well, which is connected to the $V_{DD}$ rail. The PN junction between the P+ resistor region and its N well defines a diode $D_3$ connected to the $V_{DD}$ rail. Resistor $R_4$ is formed in the substrate in an N+ region set in a P well, which is connected to the $V_{SS}$ rail. The PN junction between the N+ resistor region and its P well defines a diode $D_4$ connected to the $V_{SS}$ rail. The resistance values for resistors $R_3$ and $R_4$ are each about 100 to 150 ohms, providing a total resistance of about 200 to 300 ohms in the path between the receiver input node 52 and the inverter input node 54.

If an ESD event occurs at bonding pad P, the relatively large diodes $D_1$ and $D_2$ provide primary ESD protection together with the ESD clamp 20 of FIG. 1. The resistors $R_3$ and $R_4$, shown in FIG. 4, provide additional protection for transistors $T_1$ and $T_2$. However, it is known that transistors $T_1$ and $T_2$ are overvoltage-sensitive, and that they are often the site of device failure.

The inventors have found, on some devices that had essentially the same ESD protection circuitry and receiver circuitry, a correlation between ESD immunity and the length of the signal line connecting the input bonding pad and the receiver input node. This length corresponds to that shown as the dimension X in the circuit of FIG. 4. When the receiver circuit was placed very close to the input bonding pad, the integrated circuit devices had a lower ESD protection capability than when the receiver circuit was placed at a greater distance X from the input bonding pad.

Certain integrated circuit devices had their receiver circuits placed about 350 microns from their input bonding pads. These devices were found to have ESD protection ratings well over 2 kV. The devices in which the receiver circuits were placed close to their input bonding pads P exhibited ESD protection ratings that fell significantly under 2 kV.

SUMMARY OF THE INVENTION

Briefly stated, the present invention provides an MOS integrated circuit device formed on a semiconductor chip having an improved electrostatic protection capability. The device includes high and low voltage rails for bringing externally-supplied power to points within the chip. Input bonding pads communicate input signals to the chip from external sources. Clamping circuitry connected to the input bonding pads clamps the input bonding pads to the low voltage rail during an electrostatic discharge event appearing on the input bonding pads. A receiver circuit is coupled to each input bonding pad. Each receiver circuit has an receiver input node, a receiver output node, and overvoltage-sensitive MOS circuitry between the input and output nodes. An inductor connects each input bonding pad to its receiver circuit. The inductor has an inductance sufficient to prevent high frequency components of ESD events received at an input bonding pad from reaching its receiver circuit. The inductor comprises a conductor including at least one fold for extending the length of the conductor to exceed the distance between the input bonding pad and the receiver input node.

BRIEF DESCRIPTION OF THE DRAWINGS

Other objects, features and advantages of the invention will be best understood from the following detailed description, when read in conjunction with the accompanying drawings, in which.

DETAILED DESCRIPTION OF THE INVENTION

Figure 5:
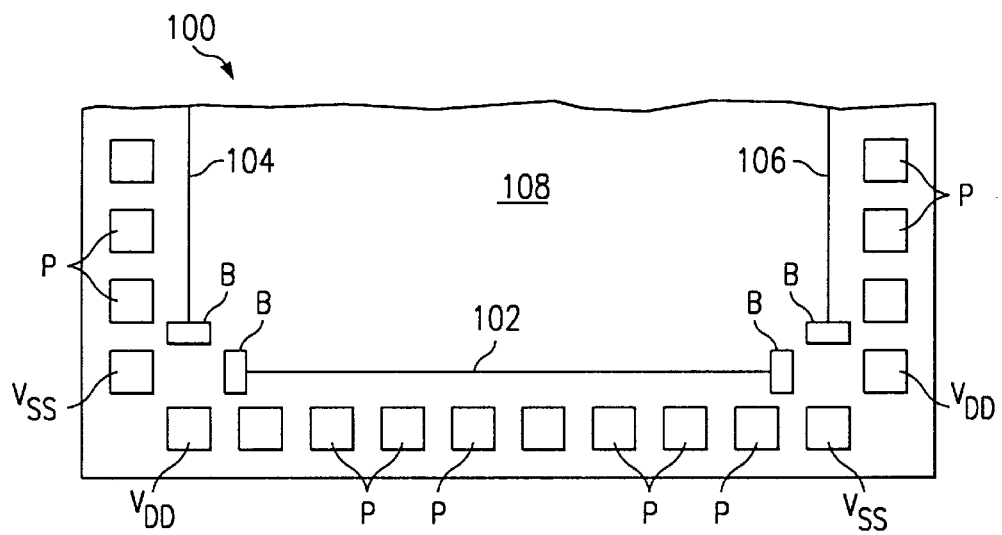
FIG. 5 is a schematic plan view of a portion of a semiconductor chip illustrating features of the present invention.

Referring to FIG. 5, a semiconductor chip shown partially broken away in plan view is designated generally by reference numeral 100. In accordance with well known techniques, the chip 100 is mounted in a housing (not shown) that protects the chip and provides connections to external circuitry. A plurality of bonding pads shown as squares at the periphery of the chip 100 enable connections to be made within the housing using very small diameter gold wires (not shown), which in turn are connected to terminals or pins (not shown) that extend outside the housing. The bonding pads provide the communications interface between input/output circuitry on the chip 100 and external circuitry. The bonding pads also provide power connections to the chip 100. For example, multiple power supply connections may be provided at different points on the chip, typically in the corners. In the two corners of the chip 100 shown in FIG. 5, a high voltage supply is received at the two bonding pads labeled $V_{DD}$. Similarly, a low voltage supply is received at the two bonding pads labeled $V_{SS}$.

The input/output pads may include pads used exclusively for input signals, pads used exclusively for output signals and so-called bidirectional pads in which a single pad may receive an input signal or send an output signal at different times. The term "input bonding pad" as used herein is intended to include pads used exclusively for input signals as well as bidirectional pads used for both input and output signals. Several of such input bonding pads are labeled with the letter P in FIG. 5. Although FIG. 5 shows the chip 100 with ten bonding pads along its lower edge and four bonding pads along each of the partially visible edges, this depiction is schematic in nature and intended to provide a general understanding of the location of bonding pads at the periphery of the semiconductor chip. Conventional semiconductor chips produced today can have many more bonding pads than the ten per side edge shown in FIG. 5.

Located just within the bonding pads along each edge of the semiconductor chip 100 are elongated conductors, which will be referred to herein as "special rails" and are labeled with reference numerals 102, 104 and 106. This feature of the preferred embodiment of the invention is particularly useful in IC devices designed to be operated by a 3.3 volt power supply and to be 5.0 volt input tolerant. Special rail 102, which is shown extending along the lower edge in FIG. 5, preferably includes identical bias circuits B connected at its ends near the corners of the chip 100. Special rails 104 and 106, which are only partially visible in FIG. 5, also preferably have identical bias circuits B at their ends. The interior of chip 100 is devoted to main function circuitry, designated generally by reference numeral 108. The main function circuitry 108 could be any type of integrated circuit including memory circuitry, but preferably comprises a gate array or other custom logic circuitry.

Figure 6:
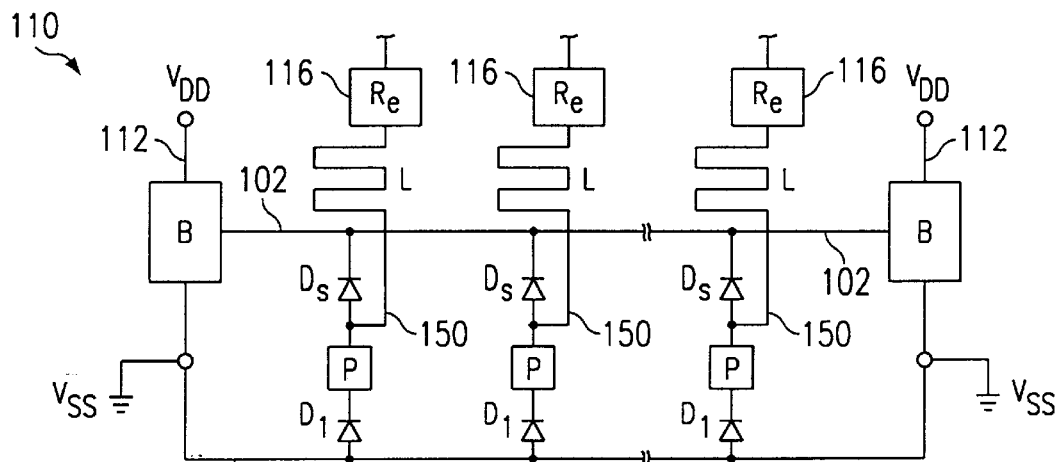
FIG. 6 is a diagram of a circuit according to the present invention.

Now referring to FIG. 6, an overvoltage protection circuit in accordance with the present invention is indicated generally by reference numeral 110. The circuit 110 is shown applied to special rail 102, which is one of four such special rails in the preferred chip layout. Bias circuits B at the ends of the special rail 102 are connected to the high and low voltage supplies $V_{DD}$ and $V_{SS}$. High voltage rails, which in actual practice are elongated metal conductors, are indicated by reference numeral 112 connecting the bias circuits B to the high voltage supply $V_{DD}$. It will be appreciated that the high voltage rails 112 run to the $V_{DD}$ bonding pads depicted in FIG. 5. A low voltage rail, which is also implemented as an elongated metal conductor, is indicated by reference numeral 114 in FIG. 6. Low voltage rail 114 may extend along the entire edge of the chip 100 and be connected at opposite ends to the $V_{SS}$ bonding pads shown in FIG. 5. It will be appreciated that FIG. 6 is an oversimplified view of the preferred overvoltage protection circuit 110 and that in the actual chip layout more complex routing of the high and low voltage rails will be provided.

FIG. 6 shows diodes $D_1$ connecting the low voltage rail 114 to respective input bonding pads P, and diodes $D_S$ connecting each input bonding pad P to the special rail 102. Each input bonding pad P is connected to a respective receiver circuit 116 through an elongated signal line 150 connected at a node between the bonding pad P and the anode of the respective diode $D_S$. The length of the signal line 150 can be made much longer than the actual distance between the input bonding pad P and the respective receiver circuit 116 by providing multiple folded portions that define a high frequency inductor L. Signal line 150 may be fabricated as a single strip of metal in a single layer of chip 100. Alternatively, Signal line 150 may be fabricated in multiple interconnected strips on multiple layers of chip 100.

Now referring to FIG. 7, the details of the preferred bias circuit B will be described, all such bias circuits on the chip preferably being identical. A first MOS transistor $T_S$ is connected between the special rail 102 and the high voltage or $V_{DD}$ rail 112. Transistor $T_S$ is a P-channel transistor with its source connected to the $V_{DD}$ rail and its gate, drain and N well connected to the special rail 102. In normal operation, transistor $T_S$ pulls the special rail up substantially all the way to $V_{DD}$. Transistor $T_S$ functions like a diode with its cathode connected to the special rail 102 and its anode connected to the high voltage rail 112. Due to subthreshold conduction through the forward biased PN junction of diode-connected transistor $T_S$, the special rail 102 normally will be charged nearly all the way up to $V_{DD}$.

The bias circuit B further includes a second MOS transistor $T_C$ connected between the special rail 102 and the low voltage $V_{SS}$ rail 114. Transistor $T_C$ has its drain connected to the special rail 102, and its source and P well connected to the $V_{SS}$ rail 114. A capacitor C and resistor $R_B$ are connected in series between the special rail 102 and the $V_{SS}$ rail 114. The gate of transistor $T_C$ defines a node 122 that interconnects the capacitor C with the resistor $R_B$.

Figure 2:
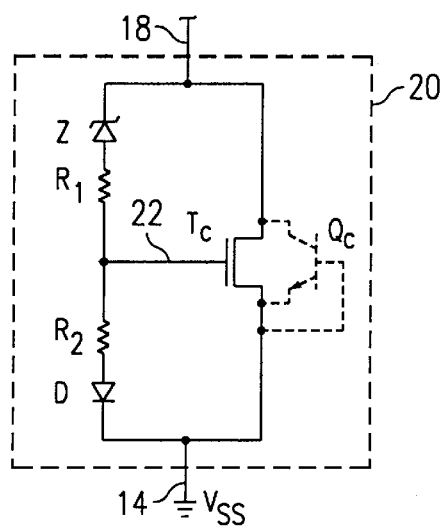
FIG. 2 is a diagram of a subcircuit of the circuit of FIG. 1.
Figure 3:
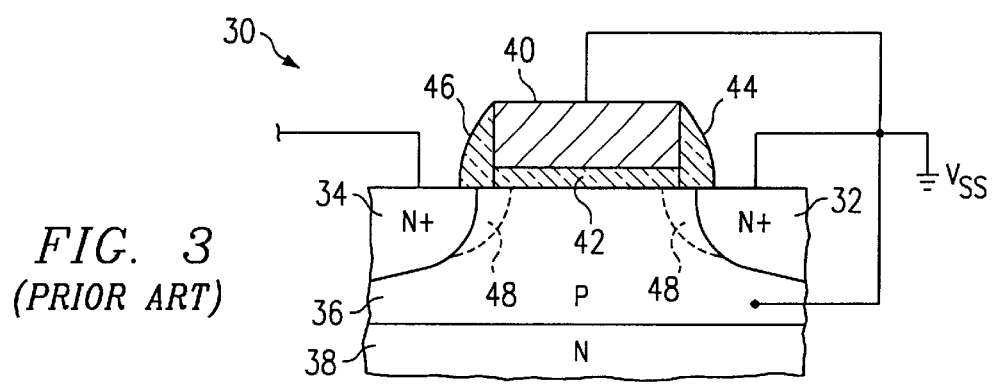
FIG. 3 is a schematic cross-section of a prior art transistor specially fabricated to provide an ESD rugged transistor, which may be useful in implementing the present invention.

Capacitor C and Resistor $R_B$ form a control circuit for controlling transistor $T_C$. The control circuit formed by capacitor C and Resistor $R_B$ turns on transistor $T_C$ whenever the voltage on special rail 102 rises rapidly to a trigger voltage level above the voltage of the high voltage supply. When the input signals received on the input bonding pads pull the special rail 102 up to a voltage in excess of the voltage on the high voltage rail 112, transistor $T_S$ isolates the special rail 102 from the high voltage rail 112. If an ESD event occurs in which a rapidly rising extremely high voltage appears at input bonding pad P as shown in FIG. 7, such voltage will quickly exceed the drain-to-source trigger voltage of transistor $T_C$ with resistor $R_B$ providing a gate-to-source voltage in excess of the threshold of transistor $T_C$, causing transistor $T_C$ to turn on quickly. Shortly after turn-on, transistor $T_C$ enters the bipolar mode of operation as depicted by the NPN bipolar transistor $Q_C$ shown in dashed outline in FIG. 7. Transistor $T_C$ is preferably an MOS transistor having a polysilicon gate, LDD spacer oxide layers at the sides of the gate, and heavily doped source and drain regions defining a channel region that extends beyond the edges of the gate, so that the opposite ends of the channel region underlie the spacer oxide layers. Most preferably, transistor $T_C$ has the characteristics of corresponding transistor $T_C$ of FIG. 2, previously described, and has a higher than normal turn-on threshold voltage in the range from about 1.2 to 2.0 volts.

Capacitor C is preferably about 2 picofarads and is fabricated to have a relatively high dielectric breakdown. Resistor $R_B$ is preferably a polysilicon resistor having a resistance in the range from 30 K-ohms to 200 K-ohms. The actual value of resistance for resistor $R_B$ is selected to be as low as possible in the preferred range so that noise on the special rail 102 during normal operation will not inadvertently trigger on transistor $T_C$. However, the resistance of $R_B$ must be selected to cause a quick turn-on of transistor $T_C$ as the special rail 102 rises above 7 volts at the onset of an ESD event. State-of-the-art IC devices that are designed for operation with 3.3 volt supplies have ultrathin gate oxides, and therefore are highly sensitive to overvoltage. In the preferred ESD clamp shown in FIG. 7 used to protect such devices, the values of capacitor C and resistor $R_B$ as well as the structure of clamping transistor $T_C$ are selected to ensure a trigger voltage level in the range of 7.0 to 7.5 volts.

Figure 4:
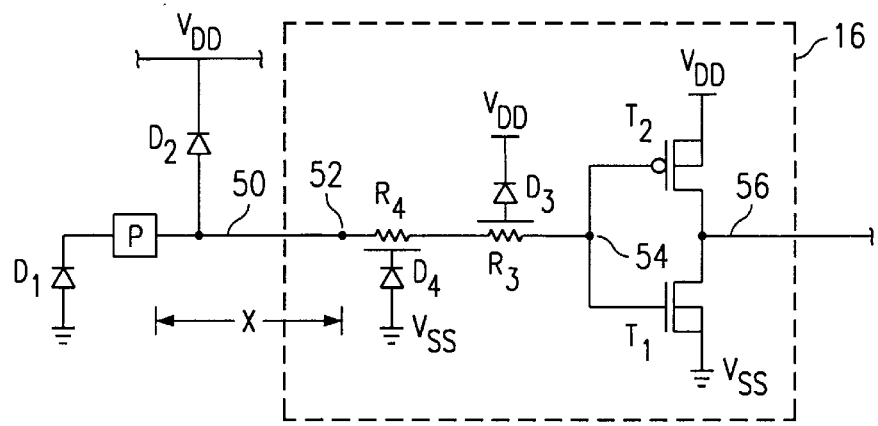
FIG. 4 is a diagram of another subcircuit of the circuit of FIG. 1.
Figures 7, 8, 9:
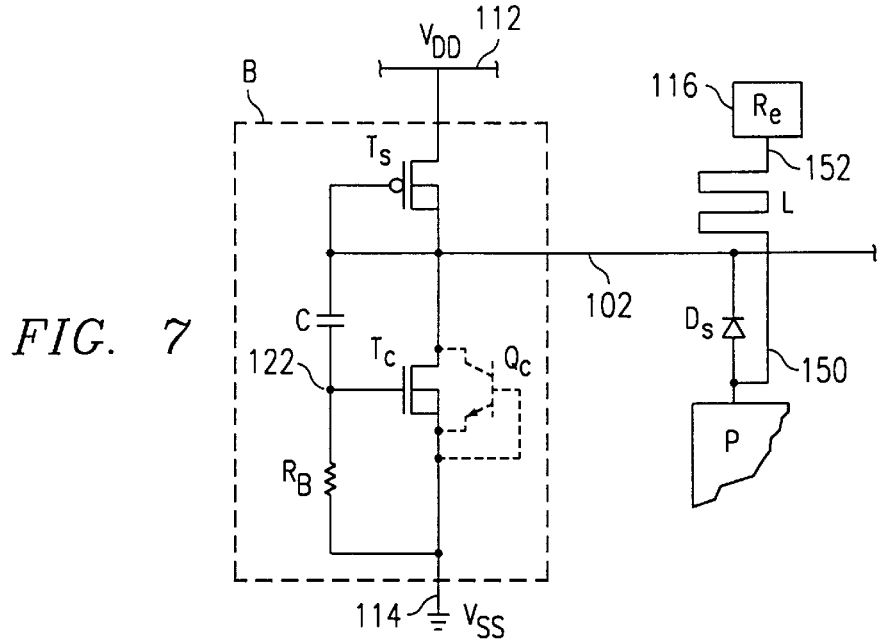
FIG. 7 is a diagram of a subcircuit of the circuit of FIG. 6.
FIG. 8 is a diagram of another subcircuit of the circuit of FIG. 6.
FIG. 9 illustrates the construction of a multi-layer inductor.

Referring to FIG. 8, a preferred receiver circuit is shown in the dashed outline 116. Since the preferred overvoltage protection circuit of the present invention is designed to operate from a 3.3 volt supply, the receiver 116 has a somewhat different design than the receiver 16 of FIG. 4. The receiver 116 has a CMOS inverter consisting of transistors $T_1$ and $T_2$ with their common gate connection defining an inverter input node 154 and their common drain connection defining an inverter output node 156. An N-channel transistor $T_3$ and a resistor $R_3$ are connected in series between the receiver input node 152 and the inverter input node 154. Resistor $R_3$, like its counterpart in the receiver circuit 16 of FIG. 4, preferably has a resistance of about 100 to 150 ohms, and is formed in the substrate in a P+ region set in an N well, which is connected to the $V_{DD}$ rail. The PN junction between the P+ resistor region and its N well defines a diode $D_3$ connected to the $V_{DD}$ rail.

Transistor $T_3$ shown in FIG. 8 is called a "dropping" transistor whose purpose is to reduce the voltage at the inverter input node 154 to protect the more sensitive transistors $T_1$ and $T_2$. Transistor $T_3$ is made less sensitive to overvoltages by eliminating the normal salicide layer on its gate and the surfaces of its source and drain regions.

In accordance with standard processing techniques, a salicide layer is normally provided on the top surface of the polysilicon gate strips and on the silicon surfaces of the transistor source and drain regions by depositing an extremely thin layer of titanium and reacting it at a high temperature with the silicon. This produces what is known as salicide, which is useful in reducing resistivity and making better metal-to-silicon contacts. To prevent salicide formation, an oxide/nitride mask is formed over those portions of the chip where no salicide is desired. Then the titanium deposition step is performed followed by the high temperature reaction step. The nitride and oxide layers of the oxide/nitride mask are then stripped away. Fabricating transistor $T_3$ in this manner provides better ESD immunity because the salicide layer is known to contribute to dielectric breakdown.

Another P-channel transistor $T_4$ is provided in series between the $V_{DD}$ rail and the CMOS inverter. The gate of transistor $T_4$ is connected through a resistor $R_4$ to the receiver input node 152. The drain of transistor $T_4$ is connected to the source of transistor $T_2$. The source of transistor $T_4$ and its N well are connected to the $V_{DD}$ rail. Resistor $R_4$ has a resistance of about 10 K-ohms and may be formed in a polysilicon strip, which may be part of the strip defining the gate of transistor $T_4$. Although such polysilicon strips are ordinarily low resistivity conductors, the portion defining resistor $R_4$ can be increased in resistance by leaving off the salicide layer, as described above.

P-channel transistor $T_4$ and resistor $R_4$ are included in the circuit to ensure complete turnoff of the CMOS inverter ($T_1$ and $T_2$) when the receiver circuit 116 receives a logic high signal that is somewhat below the $V_{DD}$ level. This technique has been used in prior art receivers. As those skilled in the art will appreciate, the receiver 116 must be able to properly respond to TTL logic level signals by providing corresponding inverted signals on the receiver output node 156 at standard MOS signal levels. According to industry standards, a TTL logic high signal may be in the range from 2.0 to 5.5 volts. Conditioning such a signal for use in the MOS IC device is an essential function of the receiver 116.

N-channel transistor $T_3$, which is a nonsalicided transistor, is less sensitive to overvoltages than salicided N-channel transistor $T_1$ of the CMOS inverter. Because salicided P-channel transistors $T_2$ and $T_4$ have their sources and N wells tied to $V_{DD}$, they can withstand somewhat higher voltages applied to their gates than salicided N-channel transistor $T_1$. In the receiver circuit 116 of FIG. 8, the $V_{DD}$ rail will be at 3.3 volts and dropping transistor $T_3$ will pass only 2.7 volts (one threshold below $V_{DD}$) of the voltage appearing at the receiver input node 152 through to the inverter input node 154. The sensitive N-channel transistor $T_1$ thus only needs to withstand a gate-to-source voltage at a safe margin above 2.7 volts. The technique of using a dropping transistor such as transistor $T_3$ to protect the sensitive N-channel transistor $T_1$ of the CMOS inverter has been used in prior art receivers.

A significant aspect of the preferred overvoltage protection circuit is seen in FIG. 8. The folded inductor L, which is effective to cutoff high frequencies, is provided in the signal line 150 between the input bonding pad P and the receiver input node 152. Also, the input bonding pad P is connected through diode $D_S$ to the special rail 102 labeled SR in FIG. 8, whereas in the circuit of FIG. 4 the input bonding pad P is connected through diode $D_2$ to the $V_{DD}$ rail 112. The incorporation of the special rail SR facilitates the use of 3.3 volt IC devices with 5.0 volt input signals by preventing such higher voltage signals from reaching the $V_{DD}$ rail.

Referring again to FIG. 7, the high frequency inductor L is depicted as having a folded portion comprising four transverse segments, which increase the effective length of the signal line 150 by the sum of the lengths of the four transverse segments when compared to a straight signal line connection between the input bonding pad P and the receiver 116. Any number of folded segments can be used to increase the effective length of the signal line 150 to a desired length that exceeds the distance between the input bonding pad P and the receiver input node 152. The overall length of the signal line 150 should be in the range from 200 microns to 500 microns with the preferred length being between about 300 to 400 microns.

The high frequency inductor L can be implemented in a serpentine conductor pattern in a single metal layer or it can be implemented in interconnected segments in multi-level metal layers. As shown in FIG. 9, a multi-level embodiment of inductor L is connected between an input pad P and a receiver circuit 116. Inductor L comprises a plurality of transverse metal strips, such as the strips 175a and 175b, deposited with conventional aluminum deposition techniques in one layer, and a plurality of generally S-shaped metal strips, such as the strips 177a and 177b, deposited in a second layer. Strips 177a and 177b include a transverse portion and oppositely directed longitudinal portions. Strip 177a is connected to input bonding pad P. The last strip 177c of the second layer provides connection to the receiver circuit 116. Strips 175 are separated from strips 177 by an insulating layer (not shown), and are interconnected by metal vias 179 through the insulating layer. A multi-level implementation of an inductor is described in U.S. patent application entitled "Method for Realizing Magnetic Circuits in an Integrated Circuit," Ser. No. 08/761,185, filed Dec. 6, 1996, by Capocelli et al., which issued as U.S. Pat. No. 5,936,298.

At low frequencies, the inductor L appears as a short circuit between the input bonding pad P and the receiver circuit 116. However, a substantial amount of the energy of an ESD event is at frequencies from about 300 to 500 megahertz (MHz) to well into the gigahertz (GHz) range. At such high frequencies, the inductor L acts as a high impedance, preventing the receiver 116 from seeing the extremely high voltages characteristic of the onset of an ESD event, which occur prior to the turn-on of transistor $T_C$. Once transistor $T_C$ turns on, a low impedance path is provided between the input bonding pad P and the $V_{SS}$ rail 114. Thus, with an appropriately selected value for the inductor L, which is proportional to its length, the receiver 116 will not see any potentially damaging overvoltage during the very short time between the onset of the ESD event and the turn-on of transistor $T_C$.

The maximum frequency response of the receiver 116 may be as high as about 200 MHz for use in high speed IC devices. Therefore, the length of the inductor L is selected to provide an inductance that does not attenuate signals up to 200 MHz, but begins to attenuate signals at higher frequencies. The inductance value should be selected to have a significant attenuating effect at frequencies beginning at the greater of about 300 MHz and twice the maximum frequency response of the receiver circuit. For state-of-the-art IC devices with a maximum frequency response of 200 MHz, the inductance of inductor L should be selected to begin having a significant attenuating effect for frequencies starting at about 400 megahertz to be effective in protecting the receiver circuit from the overvoltages at the very high frequencies seen during an ESD event. An inductance of about 0.2 to 0.3 nanohenry (nH) should be suitable for this purpose.

Figure 1:
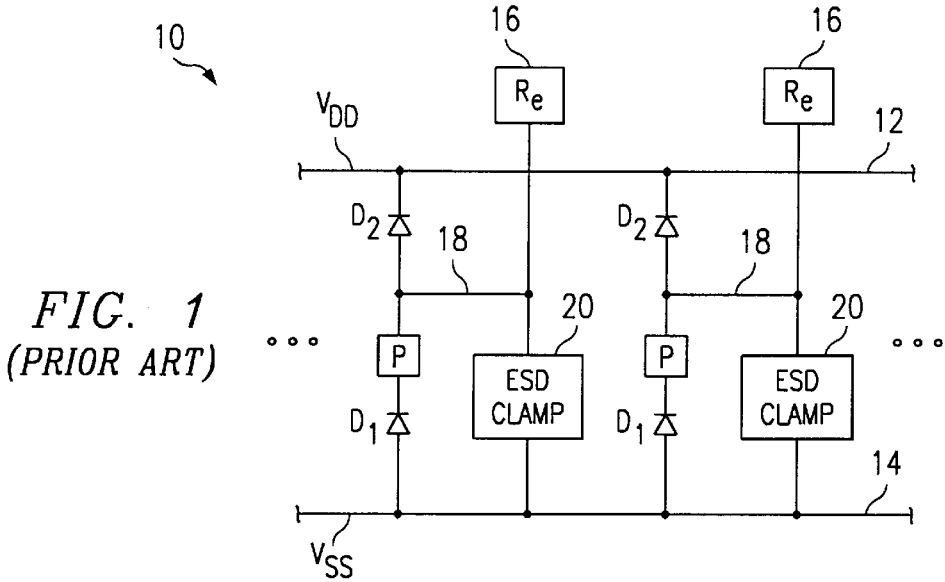
FIG. 1 is a diagram of a portion of a prior art overvoltage protection circuit.

The overvoltage protection circuit of the present invention has advantageous application in an integrated circuit device designed to operate on a 3.3 volt supply. In such a device, if the input bonding pads were connected through diodes $D_2$ to the $V_{DD}$ rail 12 as shown in the prior art circuit of FIG. 1, input signals, which can be at 5 volts, received on the bonding pads P would turn on the diodes $D_2$. Such 5 volt input signals would see a low impedance path through the $V_{DD}$ rail 12 to the external power supply source, with a possibility of such high current flow through the bonding pads that the small gold wires connected to the bonding pads could melt. It will be appreciated that other potentially damaging results could occur by reason of such an imbalance between voltages seen on the input bonding pads and the $V_{DD}$ supply voltage.

By contrast, the circuit of the present invention shown in FIG. 6 connects the input bonding pads P through diodes $D_S$ to the special rail 102, which can be pulled up to a voltage above the $V_{DD}$ supply voltage without any damaging consequences. It will be seen from FIG. 7 that transistor $T_S$ will turn off as soon as the special rail 102 is pulled to a higher voltage than the voltage appearing on the $V_{DD}$ rail 112. Moreover, pulling the special rail 102 up to 5 volts even relatively rapidly will be insufficient to turn on transistor $T_C$, since it has a relatively high turn-on threshold voltage. Therefore, there is no danger that a high logic level at 5 volts applied to the input bonding pad P will trigger the bias circuit B into its overvoltage protection mode so as to interfere with proper interpretation of the incoming signals by the receiver circuits 116.

Although preferred embodiments of the invention have been described in detail, it will be understood by those skilled in the art that various modifications can be made therein without departing from the spirit and scope of the invention as set forth in the appended claims.

What is claimed is:

1. An integrated circuit device formed on a semiconductor chip and having improved overvoltage protection capability, comprising:

high and low voltage rails for bringing externally-supplied power to circuitry within the chip;

input bonding pads for communicating input signals to the chip from an external source;

a receiver circuit coupled to each input bonding pad;

a special rail being charged in normal operation to a voltage near the voltage on the high voltage rail, the special rail being isolated from the input bonding pads that are receiving low logic level inputs during normal operation; and a clamping transistor connected between the special rail and the low voltage rail, the clamping transistor turning on at the onset of an electrostatic discharge event of positive voltage appearing on the input bonding pads to couple the input bonding pads through the special rail to the low voltage rail, whereby the receiver circuits are protected from the overvoltage of the electrostatic discharge event.

2. The integrated circuit device as claimed in claim 1 further including an inductor connecting each input bonding pad to its receiver circuit.

3. The integrated circuit device as claimed in claim 1 wherein the special rail is coupled to each input bonding pad during an electrostatic discharge event by a diode connected between the special rail and each input bonding pad, wherein inputs on the input bonding pads above the voltage of the high voltage rail applied during normal operation charge the special rail through the respective diodes to a voltage slightly above the voltage on the high voltage rail without turning on the clamping transistor.

4. The integrated circuit device as claimed in claim 1 wherein the clamping transistor is an MOS transistor that has a parasitic bipolar mode of operation.

5. The integrated circuit device of claim 4 further comprising a capacitor connected between the special rail and the gate of the clamping transistor, and a resistor connected between the gate of the clamping transistor and the low voltage rail, the capacitor and resistor being sized to rapidly bring the gate of the clamping transistor to a voltage above its turn-on threshold at the onset of the electrostatic discharge event.

6. The integrated circuit device of claim 5 wherein the capacitor has a capacitance of about 2 picofarads.

7. The integrated circuit device of claim 5 wherein the MOS clamping transistor has a turn-on threshold of between about 1.2 and 2.0 volts.

8. The integrated circuit device of claim 5 wherein the resistor is a polysilicon resistor having a resistance in the range from 30 K-ohms to 200 K-ohms.

9. The integrated circuit device of claim 5 further comprising a diode-connected MOS transistor connected between the high voltage rail and the special rail for initially charging the special rail to a voltage near the voltage on the high voltage rail.

10. The integrated circuit of claim 1 wherein the special rail extends along one edge of the semiconductor chip adjacent to a first set of input bonding pads along that edge, and further comprising a diode connecting each input bonding pad of the first set to the special rail, wherein the clamping transistor provides a path to ground for multiple input bonding pads of the first set through their respective diode connections to the special rail during an electrostatic discharge event.

11. The integrated circuit of claim 1 wherein each receiver circuit has an input node and an output node, and includes a CMOS inverter having an input node and an output node, the CMOS inverter's output node defining the receiver's output node, and further comprising a dropping transistor series connected with a resistor between the receiver's input node and the inverter's input node, wherein the dropping transistor has a non-metalized polysilicon gate and the resistor is formed in a substrate well.

12. An MOS integrated circuit device formed on a semiconductor chip and having an improved electrostatic discharge protection capability, comprising:

high and low voltage rails for bringing externally-supplied power to circuitry within the chip;

input bonding pads for communicating input signals to the chip from external sources;

clamping circuitry connected to the input bonding pads for clamping the input bonding pads to the low voltage rail during an electrostatic discharge event appearing on the input bonding pads;

a receiver circuit coupled to each input bonding pad, each receiver circuit having a receiver input node, a receiver output node and overvoltage-sensitive MOS circuitry between the input and output nodes, and each receiver circuit having a maximum frequency response; and a conductor connecting each input bonding pad to the input node of its receiver circuit, the conductor having a length greater than the distance between the input bonding pad and the receiver input node, said conductor having an inductance sufficient to attenuate frequencies greater than the maximum frequency response of its receiver circuit, wherein said conductor comprises a first layer of metal strips interconnected with a second layer of metal strips, the first and second layers being disposed at different levels to define a multi-level inductor on the semiconductor chip, wherein the metal strips of said conductor include a generally S-shaped metal strip in one layer and a transverse metal strip in the other layer interconnected with the S-shaped metal strip by a metal via.

13. The integrated circuit device as claimed in claim 12, wherein said inductance is about 0.3 nanohenry.

14. The integrated circuit device as claimed in claim 12, wherein said conductor has an effective length of at least 200 microns.

15. The integrated circuit device as claimed in claim 14, wherein said conductor has an effective length of 300 to 400 microns.

16. The integrated circuit device as claimed in claim 12, wherein said conductor has an inductance sufficient to attenuate frequencies greater than about 300 MHz.

17. An MOS integrated circuit device formed on a semiconductor chip and having an improved electrostatic discharge protection capability, comprising:
- high and low voltage rails for bringing externally-supplied power to circuitry within the chip;
- input bonding pads for communicating input signals to the chip from external sources;
- clamping circuitry connected to the input bonding pads for clamping the input bonding pads to the low voltage rail during an electrostatic discharge event appearing on the input bonding pads;
- a receiver circuit coupled to each input bonding pad, each receiver circuit having a receiver input node, a receiver output node and overvoltage-sensitive MOS circuitry between the input and output nodes; and
- a conductor connecting each input bonding pad to the input node of its receiver circuit, the conductor having a length greater than the distance between the input bonding pad and the receiver input node, said conductor having an inductance of about 0.3 nanohenries and an effective length of at least 200 microns, wherein said conductor comprises a first layer of metal strips interconnected with a second layer of metal strips, the first and second layers being disposed at different levels to define a multi-level inductor on the semiconductor chip.

18. The integrated circuit device as claimed in claim 17, wherein said conductor has an effective length of 300 to 400 microns.

19. The integrated circuit device as claimed in claim 17, wherein the metal strips of said conductor include a generally S-shaped metal strip in one layer and a transverse metal strip in the other layer interconnected with the S-shaped metal strip by a metal via.

20. The integrated circuit device of claim 17, wherein the metal strips of said conductor include generally S-shaped metal strips in one layer and transverse metal strips in the other layer interconnected in alternating series relationship with the S-shaped metal strips by metal vias.

* * * * *